United States Patent
Khorram

(10) Patent No.: US 6,998,709 B2
(45) Date of Patent: Feb. 14, 2006

(54) RFIC DIE-PACKAGE CONFIGURATION

(75) Inventor: Shahla Khorram, Irvine, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/702,402

(22) Filed: Nov. 5, 2003

(65) Prior Publication Data

US 2005/0093132 A1    May 5, 2005

(51) Int. Cl.
*H01L 23/34*    (2006.01)

(52) U.S. Cl. .................. 257/728; 257/664; 257/778; 29/600; 29/601

(58) Field of Classification Search .............. 257/728, 257/664, 692, 778; 343/700 R; 29/600, 29/601
See application file for complete search history.

(56) References Cited

U.S. PATENT DOCUMENTS 5,371,404 A * 12/1994 Juskey et al. ............... 257/659
6,580,163 B2 * 6/2003 Poulin ......................... 257/678
6,787,901 B2 * 9/2004 Reyes et al. ................. 257/724
6,807,063 B2 * 10/2004 Shimura et al. ............. 361/764
2004/0164382 A1 * 8/2004 Gerber et al. ............... 257/666

FOREIGN PATENT DOCUMENTS

EP    1 126 522 A1 *  8/2001
WO      99/67754    * 12/1999

* cited by examiner

*Primary Examiner*—Jasmine Clark
(74) *Attorney, Agent, or Firm*—Garlick, Harrison & Markison, LLP; Timothy W. Markison

(57) ABSTRACT

A RFIC includes a die and a package. The die contains a radio frequency (RF) input/output (I/O) section, an RF-to-baseband conversion section, and a baseband processing section. The package includes a plurality of connections for connecting to the die. The die is positioned within the package to minimize adverse affects of parasitics components of coupling the RFIO section to an antenna. The positioning of the die within the package may be offset from the center of the package and/or positioned at the edge of the package.

5 Claims, 5 Drawing Sheets

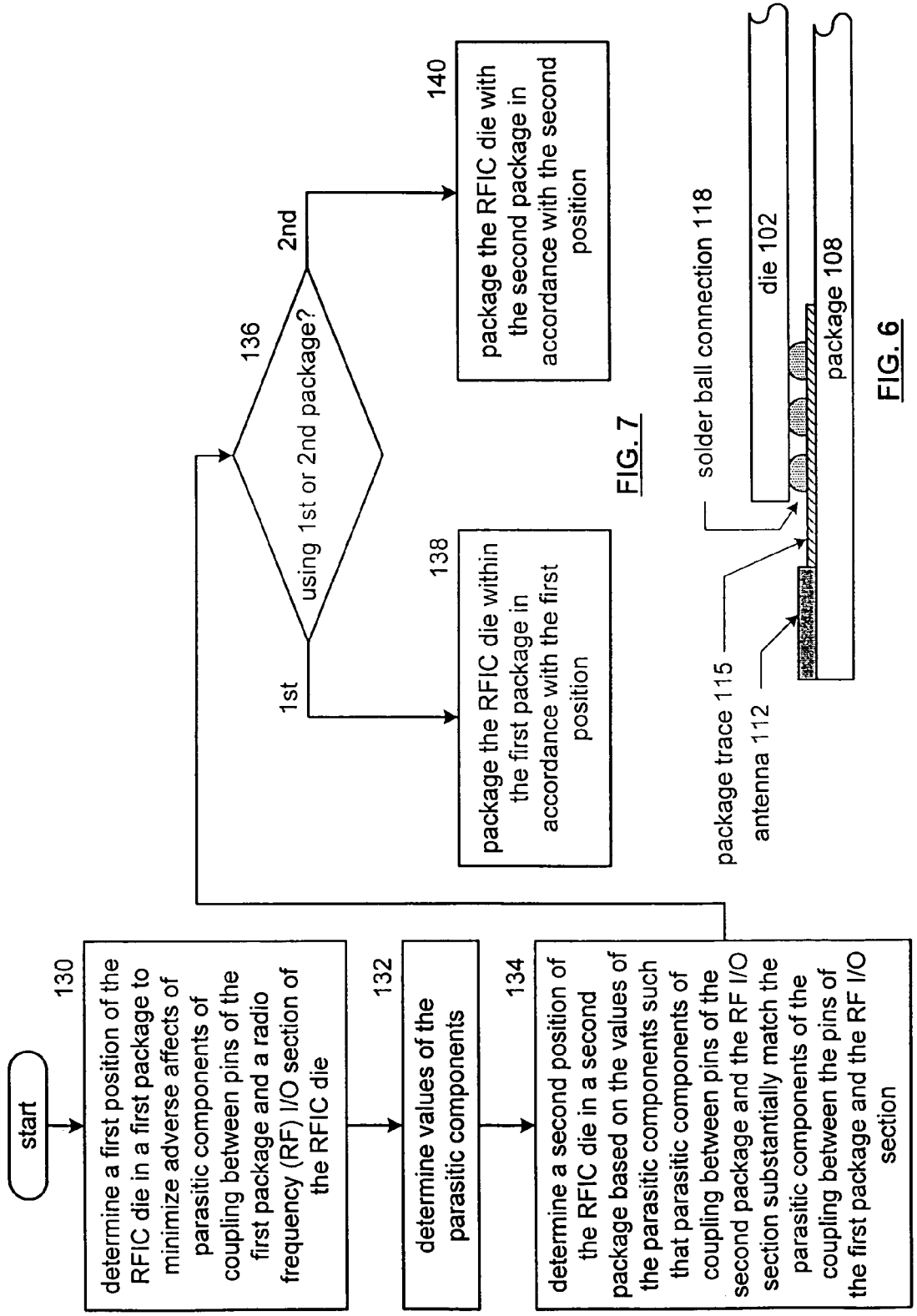

RFIC DIE-PACKAGE CONFIGURATION

BACKGROUND OF THE INVENTION

1. Technical Field of the Invention

This invention relates generally to wireless communication devices and more particularly to radio frequency integrated circuits used within such wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

A critical issue with any mixed signal circuit, including radio transceivers, is minimizing noise, especially at the sensitive points within the mixed signal circuitry. In radio transceivers, one sensitive point is the receiver input that receives radio frequency (RF) signals from an antenna. To minimize noise sensitivity, a receiver input includes a low noise amplifier to receive and subsequently amplify incoming RF signals. Further, most low noise amplifiers are designed to have an input impedance to substantially match the impedance of the antenna at radio frequencies. Alternatively, the receiver may include an impedance matching circuit between the antenna and low noise amplifier to provide the desired impedance matching.

When the RF transceiver is implemented as an integrated circuit, it includes a die mounted within a package. The packages die (i.e., the integrated circuit) is then mounted on a printed circuit board, which includes the antenna. Conventional packaging of the die may be done using commercial packages (e.g., ball grid array (BGA), LPCC, et cetera) where the die is placed in the center of the package. While such packaging has provided adequate performance in the past, as radio frequencies increase and/or the data throughput demands increase, such conventional packaging provides unacceptable levels of parasitic components (e.g., capacitance and/or inductance). Such parasitics increase the noise levels of the radio frequency integrated circuit, degrade the input signal to the radio receiver, degrade output power of the radio transmitter, and thus limit the radio transceiver's overall performance.

Therefore, a need exists for a radio frequency integrated circuit die packaging configuration that minimizes adverse affects of packaging parasitics.

BRIEF SUMMARY OF THE INVENTION

The radio frequency integrated circuit (RFIC) die-package configuration of the present invention substantially meets these needs and others. In one embodiment, a RFIC includes a die and a package. The die contains a radio frequency (RF) input/output (I/O) section, an RF-to-baseband conversion section, and a baseband processing section. The package includes a plurality of connections for connecting to the die. The die is positioned within the package to minimize adverse affects of parasitics components of coupling the RFIO section to an antenna. The positioning of the die within the package may be offset from the center of the package and/or positioned at the edge of the package. By minimizing parasitic components between the RFIO section of the RFIC and the antenna, parasitic component levels are reduced thereby improving overall performance of the RFIC.

In another embodiment, a method for packaging a radio frequency integrated circuit (RFIC) in multiple packages begins by determining a $1^{st}$ position of the RFIC die in a $1^{st}$ package wherein the positioning is such to minimize adverse affects of parasitic components of coupling between the radio frequency input/output section and an antenna. Once the position within the $1^{st}$ package has been determined, the corresponding parasitics are measured to determine their values. The processing then continues by determining a $2^{nd}$ position of the RFIC die in a $2^{nd}$ package based on the values of the parasitic components. Accordingly, the $2^{nd}$ position places the die within the $2^{nd}$ package such that the parasitic components of coupling between the RF I/O section to the antenna within the $2^{nd}$ package substantially matches the parasitic components of coupling the RFIO section to the antenna in the $1^{st}$ package. Accordingly, different packages may be used with the same RFIC die, while maintaining the desired noise reduction.

In another embodiment, a radio frequency integrated circuit (RFIC) includes a die, and a package. In this embodiment, the die includes a radio frequency input/output (RF I/O) section, a radio frequency to baseband conversion section and a baseband processing section. The packaging includes a ball grid array and an antenna. The antenna is located on one edge of the package. Solder balls of the ball grid array proximal to the antenna are used to couple the RF I/O section of the die to the antenna. By minimizing the trace length of coupling between the RF I/O section of the die and the antenna, the parasitic components are reduced thereby improving overall radio transcevier performance.

BRIEF DESCRIPTION OF THE SEVERAL VIEWS OF THE DRAWINGS

FIG. 6 is an alternate graphical representation of coupling a die to an antenna in accordance with the present invention; and FIG. 7 is a logic diagram of a method for multiple packaging of a radio frequency integrated circuit in accordance with the present invention.

DETAILED DESCRIPTION OF THE INVENTION

Figure 1:
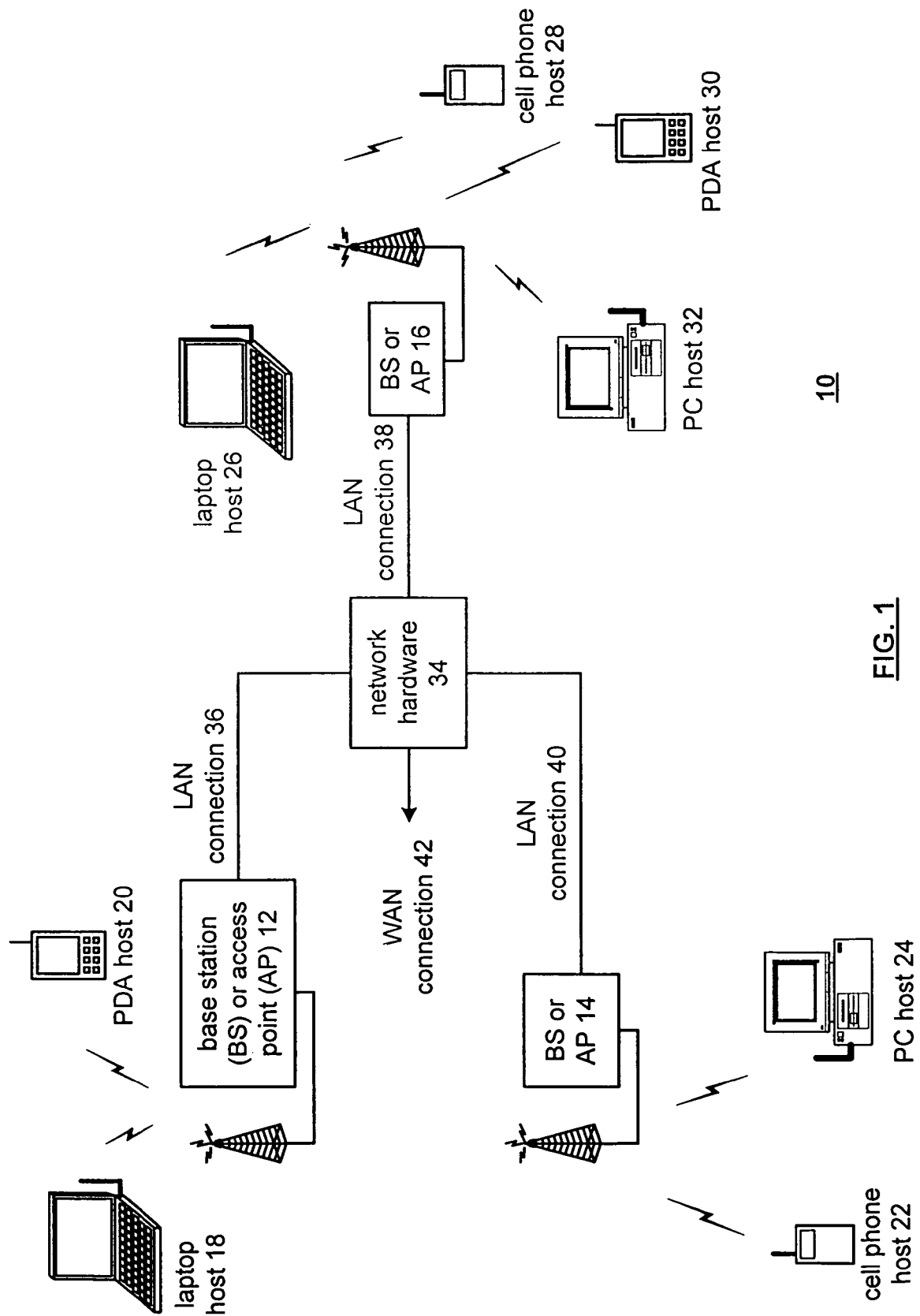
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
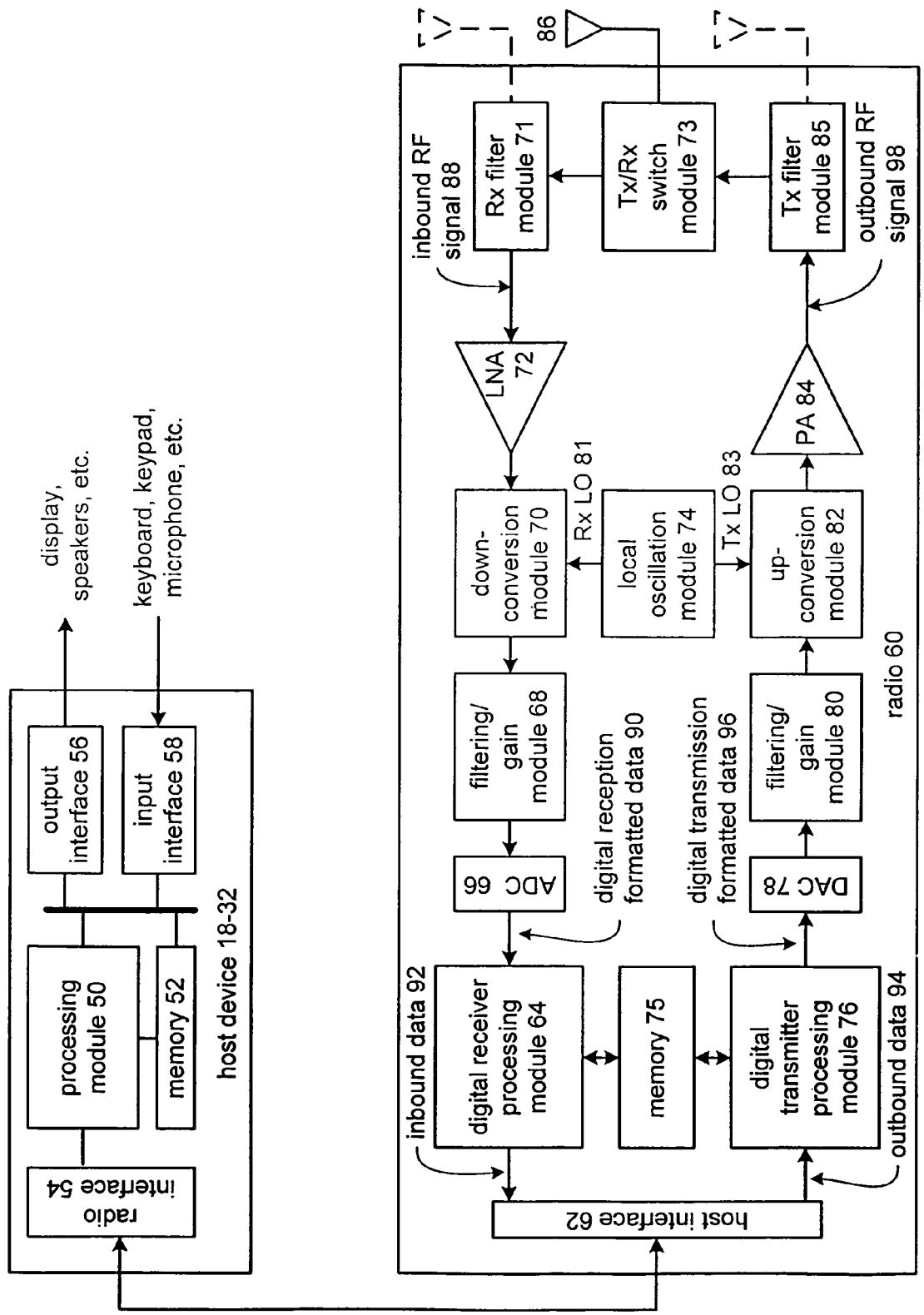
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
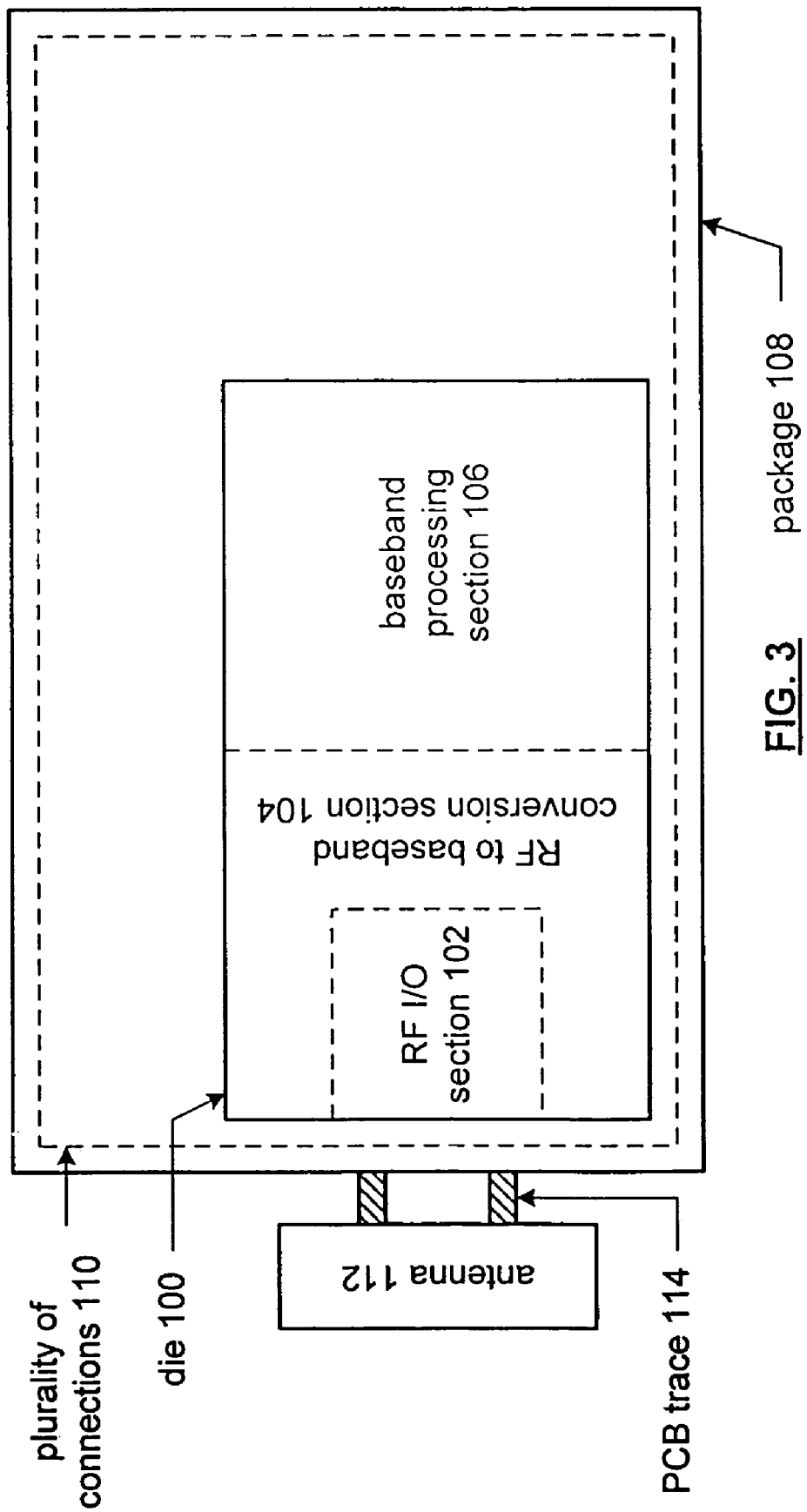
FIG. 3 is a graphical representation of a radio frequency integrated circuit in accordance with the present invention.

FIG. 3 is a graphical representation of a radio frequency integrated circuit (RFIC) that includes a die 100, and a package 108. The die 100 includes a radio frequency I/O (RFIO) section 102, a radio frequency to baseband conversion section 104 and a baseband processing section 106. With reference to FIG. 2, the RFIO section 102 includes the low noise amplifier 72, the receiver filter module 71, the T/R switch module 73, the transmit filter module 85, and the power amplifier 84. The RF to baseband conversion section 104, with reference to FIG. 2, includes the down conversion module 70, filter/gain module 68, analog-to-digital converter 66, digital-to-analog converter 78, filter/gain module 80, up-conversion module 82 and local oscillation module 74. The baseband processing section 106, with reference to FIG. 2, includes the digital receiver processing module 64, memory 75 and digital transmitter processing module 76.

Returning to the discussion of FIG. 3, the package 108 includes a plurality of connections 110, which may include a ball grid array or the package may be an LPCC. In any configuration of the package 108, the die 100 is positioned to minimize the trace connection from the RFIO section 102 to the antenna 112. In this embodiment, the antenna 112 is mounted and/or fabricated on a printed circuit board (PCB) which is coupled via PCB traces 114 to the RE I/O section 102 and, as such, is off-die. Note that the die is off-centered with respect to the package 108 to provide the minimal distance coupling between the RF I/O section 102 and antenna 112. Remaining connections for the baseband processing section 106 may include longer traces within package 108 to interconnecting solder balls and/or pins of the package to the PCB without adversely affecting the overall performance of the RFIC. Accordingly, by minimizing the distance between the RE I/O section 102 and the off-die antenna 112, the corresponding parasitics that are produced by the printed circuit board trace 114, the coupling of the die 100 to the package 108, and the coupling of the package 108 to the printed circuit board traces 114 are minimized such that at radio frequencies (e.g., 2.4 gigahertz, 5.25 gigahertz), the parasitics have negligible affect on the performance of the radio frequency integrated circuit.

Figure 4:
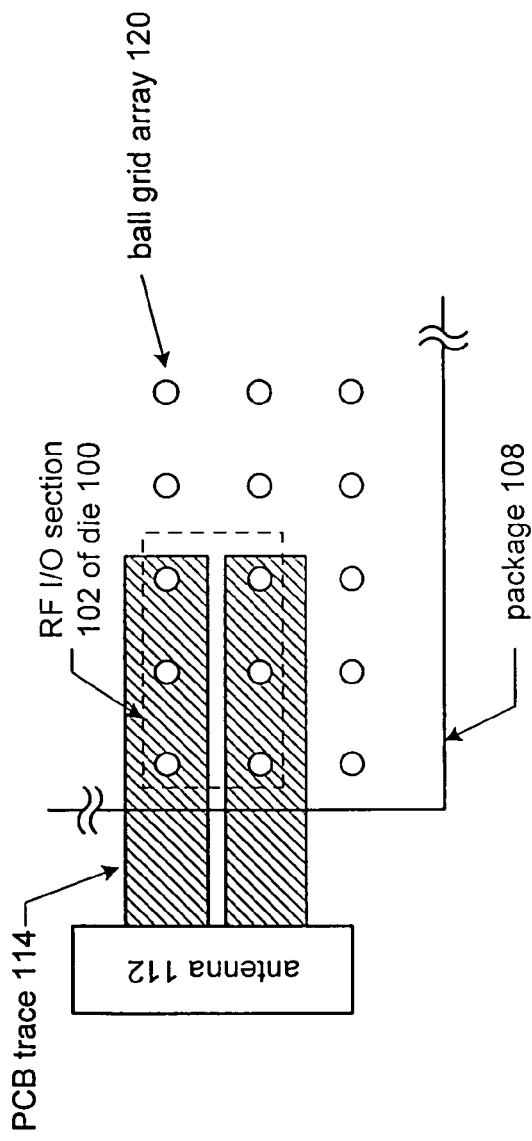
FIG. 4 is a graphical representation of coupling a die to an antenna in accordance with the present invention.

FIG. 4 is a more detailed graphical representation of coupling the RFIO section 102 of die 100 to off-die antenna 112. In this embodiment, the plurality of connections 110 includes a ball grid array 120. The solder balls of the ball grid array 120 closest to the off-die antenna 112 are used to couple the RF I/O section 102 to the package 108. Corresponding solder balls and/or pins of the package are then used to couple to PCB traces 114 to provide the connectivity to the off-die antenna 112. This is further illustrated in FIG. 5.

Figure 5:
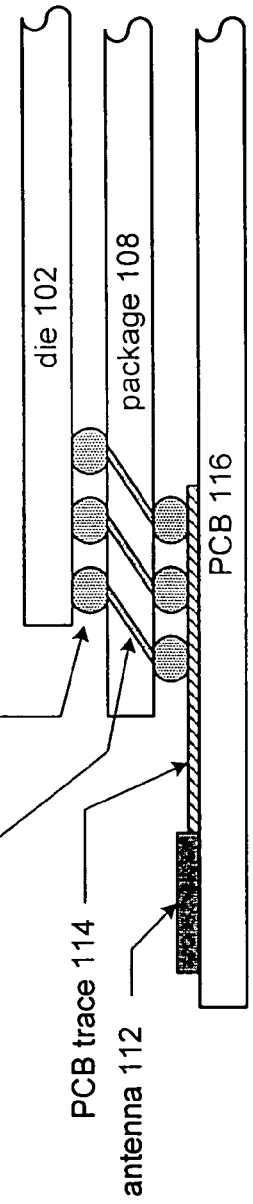
FIG. 5 is a cross-sectional side view of the coupling illustrated in FIG. 4.

FIG. 5 illustrates a side view of the coupling illustrated in FIG. 4. In this illustration, solder ball connections 118 couple RF I/O section 102 of die 100 to the package 108. Within the package 108 there are traces and/or vias that couple to solder balls and/or pins on the opposite surface of package 108. The other solder balls are then used to connect to the printed circuit board traces 114, which couple to the off-die antenna 112. Accordingly, a minimal distance between the RF I/O section 102 and the off-die antenna 112 may be obtained thereby minimizing the parasitic components and the adverse affects on the performance of the RFIC.

FIG. 6 illustrates an alternate configuration of the RFIC. In this configuration, the off-die antenna 112 is fabricated on the package 108. The RF I/O section 102 of die 100 is connected via package traces and corresponding solder balls to the off-die antenna 112 within the package. As such, the distance between the RF I/O section 102 and the off-die antenna 112 may be further reduced thereby further reducing the corresponding parasitics and minimizing the adverse affects caused thereby.

FIG. 7 is a logic diagram of a method for multiple packaging of a radio frequency integrated circuit. The process begins at Step 130 where a $1^{st}$ position of the RFIC die in a $1^{st}$ package (e.g., a ball grid array package) is determined. The position is selected to minimize adverse affects of parasitic components of the coupling between the RFIO section of the die and an antenna as described above. Such coupling includes the coupling of the die to the package and the coupling of the package to the antenna, which may be via traces of a printed circuit board and/or traces within the package. The $1^{st}$ position may be offset from center and may further be at an edge of the $1^{st}$ package. The parasitic components may include inductance and/or capacitance.

The process then proceeds to Step 132 where the values of the parasitic components are determined. The process then proceeds to Step 134 where a $2^{nd}$ position of the RFIC die within a $2^{nd}$ package (e.g., LPCC) is determined based on the values of the parasitic components. The positioning within the $2^{nd}$ die is selected such that the values of the parasitic components between the RF I/O section and the antenna substantially match the values of the parasitic components of the coupling between the RFIO section to the antenna in the $1^{st}$ package.

The process then proceeds to Step 136 where a determination is made as to whether the die will be packaged in the $1^{st}$ package or the $2^{nd}$ package. When packaged in the $1^{st}$ package, the process proceeds to Step 138 where the RFIC die is packaged within the $1^{st}$ package in accordance with the $1^{st}$ position. If the die is to be packaged in the $2^{nd}$ package, the process proceeds to Step 140 where the RFIC die is packaged within the $2^{nd}$ package in accordance with the $2^{nd}$ position.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a radio frequency integrated circuit die/packaging configuration that substantially reduces the adverse affects caused by parasitic components of the coupling between an antenna and the RF input/output section of a radio frequency integrated circuit. As one of average skill in the art will appreciate, other embodiments may be derived from the teaching of the present invention without deviating from the scope of the claims.

What is claimed is:

1. A radio frequency integrated circuit (RFIC) comprises:
   a die containing a radio frequency (RF) input/output (I/O) section; and
   a package having pluralities of connections, wherein each connection of the RF I/O section is connected to a corresponding one of the pluralities of connections to connect the RF I/O section to an off-die antenna, wherein the die is positioned off centered within the package to minimize coupling distance between the RF I/O section and the off die antenna.

2. The RFIC of claim 1, wherein the plurality of connections comprises a plurality of solder balls of a ball grid array package and the each connection of the RF I/O section including a plurality of solder balls of a ball grid array.

3. The RFIC of claim 1 further comprises positioning the die at an edge of the package.

4. The RFIC of claim 1, wherein the die further comprises:
   a radio frequency to baseband conversion section operably coupled to the RF I/O section.

5. The RFIC of claim 4, wherein the die further comprises:
   a baseband processing section operably coupled to the radio frequency to baseband conversion section.

* * * * *